(12) United States Patent
Sokolov et al.

(10) Patent No.: US 9,697,077 B2
(45) Date of Patent: Jul. 4, 2017

(54) MEMORY DEVICE WITH INTERNAL SIGNAL PROCESSING UNIT

(71) Applicant: Apple Inc., Cupertino, CA (US)

(72) Inventors: Dotan Sokolov, Ra'anana (IL); Naftali Sommer, Rishon Le-Zion (IL); Uri Perlmutter, Ra'anana (IL); Ofir Shalvi, Ra'anana (IL)

(73) Assignee: Apple Inc., Cupertino, CA (US)

( * ) Notice: Subject to any disclaimer, the term of this patent is extended or adjusted under 35 U.S.C. 154(b) by 126 days.

(21) Appl. No.: 14/740,088

(22) Filed: Jun. 15, 2015

(65) Prior Publication Data

US 2015/0309870 A1    Oct. 29, 2015

Related U.S. Application Data

(63) Continuation of application No. 14/306,764, filed on Jun. 17, 2014, now Pat. No. 9,086,993, which is a
(Continued)

(51) Int. Cl.
*G06F 11/00* (2006.01)
*G06F 11/10* (2006.01)
(Continued)

(52) U.S. Cl.
CPC ...... *G06F 11/1072* (2013.01); *G06F 11/1044* (2013.01); *G06F 11/1048* (2013.01); *G06F 11/1076* (2013.01); *G06F 12/00* (2013.01); *G11C 11/56* (2013.01); *G11C 29/50004* (2013.01); *G11C 29/52* (2013.01); *G11C 2029/5004* (2013.01)

(58) Field of Classification Search
CPC .. G06F 11/10; G06F 11/1008; G06F 11/1068; G11C 2029/0411; H03M 13/03; H03M 13/3761
See application file for complete search history.

(56) References Cited

U.S. PATENT DOCUMENTS 5,289,477 A    2/1994  Lenta et al.
5,982,659 A *  11/1999 Irrinki ................... G11C 17/00
                                                        365/100
(Continued)

*Primary Examiner* — Bryce Bonzo
*Assistant Examiner* — Jeison C Arcos
(74) *Attorney, Agent, or Firm* — Meyertons, Hood, Kivlin, Kowert & Goetzel, P.C.

(57) ABSTRACT

A method for operating a memory includes storing data in a plurality of analog memory cells that are fabricated on a first semiconductor die by writing input storage values to a group of the analog memory cells. After storing the data, multiple output storage values are read from each of the analog memory cells in the group using respective, different threshold sets of read thresholds, thus providing multiple output sets of the output storage values corresponding respectively to the threshold sets. The multiple output sets of the output storage values are preprocessed by circuitry that is fabricated on the first semiconductor die, to produce preprocessed data. The preprocessed data is provided to a memory controller, which is fabricated on a second semiconductor die that is different from the first semiconductor die. so as to enable the memory controller to reconstruct the data responsively to the preprocessed data.

20 Claims, 7 Drawing Sheets

Related U.S. Application Data continuation of application No. 13/860,211, filed on Apr. 10, 2013, now Pat. No. 8,788,906, which is a continuation of application No. 12/597,494, filed as application No. PCT/IL2008/000519 on Apr. 16, 2008, now Pat. No. 8,429,493.

(60) Provisional application No. 61/028,226, filed on Feb. 13, 2008, provisional application No. 61/017,177, filed on Dec. 28, 2007, provisional application No. 60/976,436, filed on Sep. 30, 2007, provisional application No. 61/024,561, filed on Jan. 30, 2008, provisional application No. 60/917,653, filed on May 12, 2007.

(51) Int. Cl.
*G11C 11/56* (2006.01)
*G06F 12/00* (2006.01)
*G11C 29/50* (2006.01)
*G11C 29/52* (2006.01)

(56) References Cited

U.S. PATENT DOCUMENTS

| | | | |
|---|---|---|---|
| 6,493,269 B1 | 12/2002 | Cernea | |
| 2001/0050926 A1* | 12/2001 | Kumar | H04H 20/30 370/529 |
| 2004/0117562 A1* | 6/2004 | Wu | G06F 12/0866 711/147 |
| 2004/0157614 A1* | 8/2004 | Fujita | H04J 13/16 455/447 |
| 2005/0185476 A1* | 8/2005 | Tachikawa | G06F 11/108 365/189.05 |
| 2006/0221714 A1* | 10/2006 | Li | G11C 11/5642 365/185.2 |
| 2006/0271748 A1* | 11/2006 | Jain | G11C 7/1021 711/154 |
| 2007/0189073 A1 | 8/2007 | Aritome | |
| 2008/0263265 A1* | 10/2008 | Litsyn | G11C 11/5628 711/103 |
| 2008/0263266 A1* | 10/2008 | Sharon | G11C 11/5628 711/103 |
| 2009/0144600 A1* | 6/2009 | Perlmutter | G06F 11/1068 714/763 |
| 2009/0158126 A1* | 6/2009 | Perlmutter | G06F 11/1072 714/773 |
| 2009/0199074 A1* | 8/2009 | Sommer | G06F 11/1072 714/763 |
| 2009/0240872 A1* | 9/2009 | Perlmutter | G11C 8/08 711/103 |
| 2009/0265598 A1* | 10/2009 | Lasser | G06F 11/1068 714/746 |
| 2010/0131827 A1* | 5/2010 | Sokolov | G06F 11/1072 714/763 |
| 2010/0165689 A1* | 7/2010 | Rotbard | G11C 11/56 365/45 |

* cited by examiner

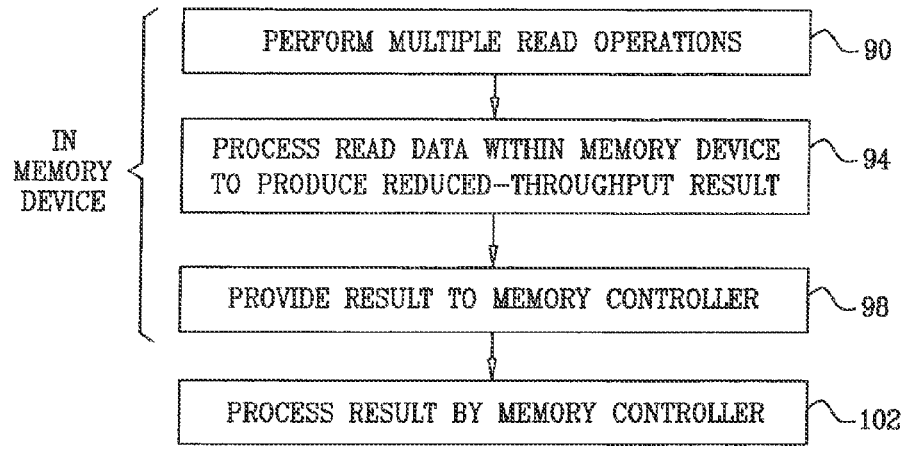
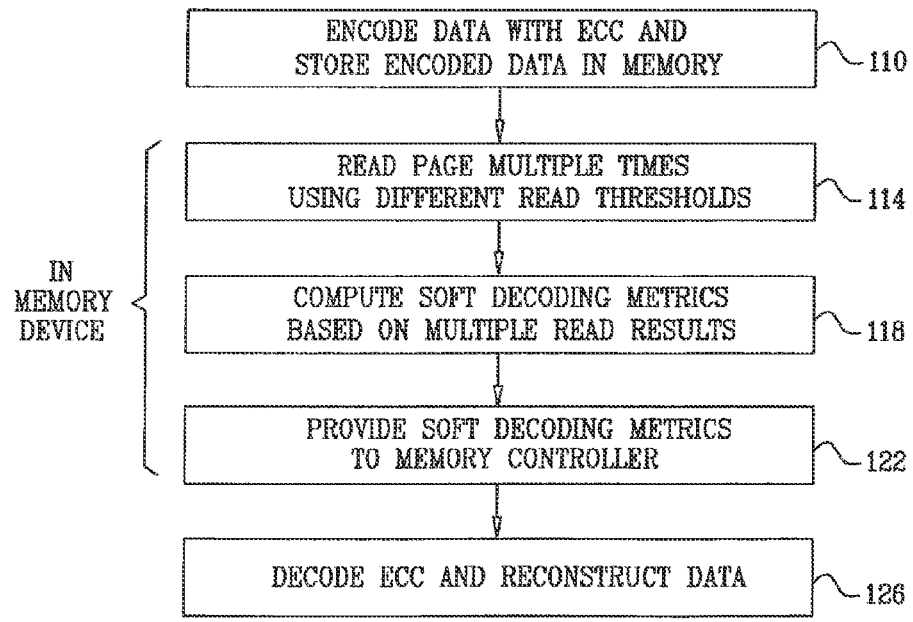

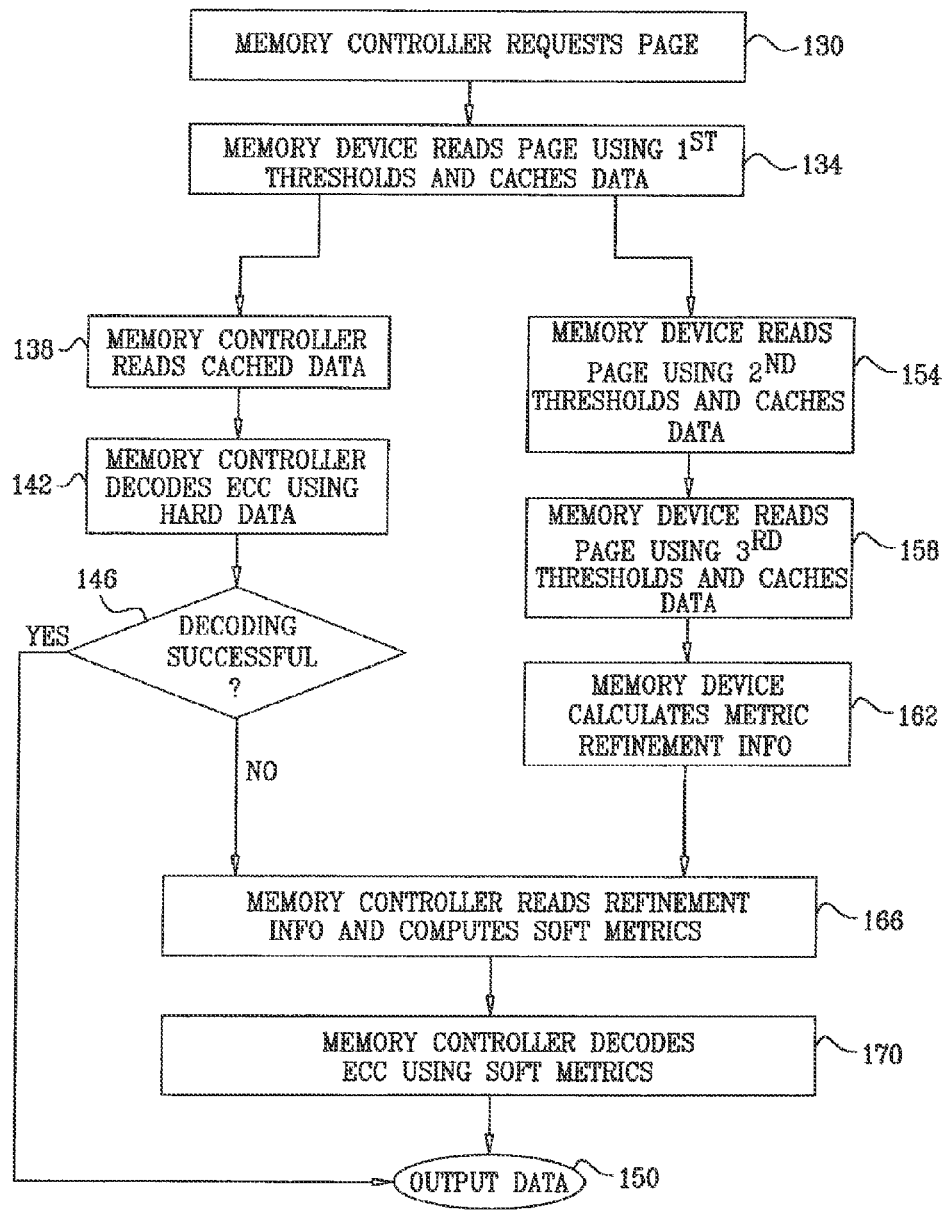

MEMORY DEVICE WITH INTERNAL SIGNAL PROCESSING UNIT

PRIORITY INFORMATION

This application is a continuation of U.S. patent application Ser. No. 14/306,764, filed Jun. 17, 2014, which is a continuation of U.S. patent application Ser. No. 13/860,211, filed Apr. 10, 2013, now U.S. Pat. No. 8,788,906, issued Jul. 22, 2014, which is a continuation application of U.S. patent application Ser. No. 12/597,494, filed Oct. 25, 2009, now U.S. Pat. No. 8,429,493, issued Apr. 23, 2013, which is a National Stage Entry Application of PCT/IL08/00519, filed Apr. 16, 2008, which claims priority from U.S. Provisional Application 61/028,226, filed Feb. 13, 2008, U.S. Provisional Application 61/024,561, filed Jan. 30, 2008, U.S. Provisional Application 61/017,177, filed Dec. 28, 2007, U.S. Provisional Application 60/976,436, filed Sep. 30, 2007, and U.S. Provisional Application 60/917,653, filed May 12, 2007, which are incorporated by reference herein in entirety.

FIELD OF THE INVENTION

Embodiments described herein are related generally to memory devices, and particularly to methods and systems for performing signal processing in memory devices.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. The storage value represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et at, in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, MINOR, AND, NOR and NAND cells.

Eitan et al, describe another type of analog memory cell called Nitride Read Only Memory (NROM) in "Can NROM, a 2-hit, Trapping Storage NVM Cell, Give a Real Challenge to Floating Gate Cells?" Proceedings of the 1999 international Conference on Solid State Devices and Materials (SSDM), Tokyo, Japan, Sep. 21-24, 1999, pages 522-524, which is incorporated herein by reference. NROM cells are also described by Maayan et at, in "A 512 Mb NROM Flash Data Storage Memory with 8 MB/s Data Rate", Proceedings of the 2002. IEEE International Solid, State Circuits Conference (ISSCC 2002), San Francisco, Calif., Feb. 3-7, 2002, pages 100-101, which is incorporated herein by reference.

Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

Various signal processing methods are used for storing data in memory devices and for retrieving data from memory devices. For example, PCT International Publication WO 2007/132453, whose disclosure is incorporated herein by reference, describes various methods and systems for estimating and canceling distortion in memory devices. Methods for estimating and canceling non-linear distortion effects are described, for example, in PCT International Publication WO 2008/026203, whose disclosure is incorporated herein by reference.

U.S. Pat. No. 7,321,509, whose disclosure is incorporated herein by reference, addresses shifts in the apparent charge stored on a floating gate of a non-volatile memory cell, which can occur because of coupling of an electric field based on the charge stored in adjacent floating gates. A read process for a given memory cell takes into account the programmed state of an adjacent memory cell, in order to compensate for the coupling. U.S. Pat. No. 7,289,344, whose disclosure is incorporated herein by reference, describes another read process, which takes into account the programmed state of a neighbor memory cell if the neighbor memory cell was programmed subsequent to the given memory cell.

U.S. Pat. No. 7,177,195, whose disclosure is incorporated herein by reference, describes methods in which storage elements are read multiple times and the results are accumulated and averaged to reduce the effects of noise or other transients that may adversely affect the quality of the read. Some methods perform full read and transfer of the data from the storage device to the controller device, with averaging performed by the controller. Other methods perform a full read of the data, with the averaging performed by the storage device. Other methods perform one full read followed by a number of faster re-reads exploiting the already established state information. These techniques may be used as the normal mode of operation, or invoked upon exception condition, depending on the system characteristics.

In some applications, the data stored in a memory device is encoded with an Error Correction Code (ECC). PCT International Publication WO 2007/132457, whose disclosure is incorporated herein by reference, describes a method, in which data is encoded using an ECC and stored as first analog values in respective analog memory cells of a memory device. After storing the encoded data, second analog values are read from the respective memory cells. A distortion that is present in the second analog values is estimated. Error correction metrics are computed with respect to the second analog values responsively to the estimated distortion. The second analog values are processed using the error correction metrics in an ECC decoding process, so as to reconstruct the data.

SUMMARY OF THE INVENTION

An embodiment of the present invention provides a method for operating a memory, including:

storing data in a plurality of analog memory cells that are fabricated on a first semiconductor die by writing input storage values to a group of the analog memory cells;

after storing the data, reading multiple output storage values from each of the analog memory cells in the group using respective, different threshold sets of read thresholds, thus providing multiple output sets of the output storage values corresponding respectively to the threshold sets;

preprocessing the multiple output sets of the output storage values by circuitry that is fabricated on the first semiconductor die, to produce preprocessed data; and providing the preprocessed data to a memory controller, which is fabricated on a second semiconductor die that is different from the first semiconductor die, so as to enable the memory controller to reconstruct the data stored in the group of the analog memory cells responsively to the preprocessed data.

In some embodiments, storing the data includes encoding the data with an Error Correction Code (ECC), preprocessing the multiple output sets includes computing ECC metrics based on the read output storage values, and providing the preprocessed data includes providing the ECC metrics to the memory controller, so as to enable the memory controller to decode the ECC using the metrics.

In an embodiment, preprocessing the multiple output sets and providing the preprocessing data include:

computing initial values of the ECC metrics responsively to a subset of the output storage values read from each of the analog memory cells, and providing the initial values to the memory controller; and responsively to a failure of the memory controller in decoding the ECC using the initial values, extending the subset with at least one additional output storage value from each of the analog memory cells, re-computing the ECC metrics responsively to the extended subset, and providing the re-computed ECC metrics to the memory controller.

In a disclosed embodiment, the initial values include hard metric values that are based on a single output storage value from each of the analog memory cells, and the re-computed ECC metrics include soft metrics that are based on multiple output storage values read from each of the analog memory cells.

In another embodiment, the method includes receiving a notification regarding the failure from the memory controller, and re-computing the ECC metrics responsively to the notification. In yet another embodiment, receiving the notification includes receiving information that characterizes the failure from the memory controller, and re-computing the ECC metrics includes modifying the ECC metrics based on the information.

In still another embodiment, preprocessing the multiple output sets includes estimating a statistical property of the output storage values, and providing the preprocessed data includes providing the estimated statistical property to the memory controller. The statistical property may include one of a mean of the output storage values, a variance of the output storage values, a number of the analog memory cells in the group whose output storage values are within a given range of values, a Probability Density Function (PDF) of the output storage values, a histogram of the output storage values, a Cumulative Distribution Function (CDF) of the output storage values and an inverse CDF of the output storage values.

In some embodiments, preprocessing the multiple output sets includes modifying the read thresholds responsively to the read output storage values. In an embodiment, the method includes receiving from the memory controller a notification regarding a failure to reconstruct the data, and modifying the read thresholds responsively to the notification. In another embodiment, receiving the notification includes receiving information that characterizes the failure from the memory controller, and modifying the read thresholds includes modifying the thresholds based on the information.

In some embodiments, the multiple output sets of the output storage values have a first size, and the preprocessed data has a second size that is smaller than the first size. Preprocessing the multiple output sets may include accepting one or more parameters from the memory controller, and preprocessing the output sets responsively to the parameters.

There is additionally provided, in accordance with an embodiment of the present invention, a method for operating a memory, including:

storing data in a plurality of analog memory cells that are fabricated on a first semiconductor die by writing first storage values to a first group of the analog memory cells;

after storing the data, reading from the memory cells in the first group second storage values, at least some of which differ from the respective first storage values due to distortion;

receiving a request from a memory controller, which is fabricated on a second semiconductor die that is different from the first semiconductor die, to cancel the distortion in the second storage values; and responsively to the request, reading third storage values from a second group of the analog memory cells, and canceling the distortion in the second storage values based on the third storage values using circuitry that is fabricated on the first semiconductor die, so as to enable the memory controller to reconstruct the data.

In some embodiments, reading the second storage values includes reading multiple sets of the second storage values using respective, different read thresholds, and canceling the distortion includes selecting, responsively to the third storage values, a second storage value that contains a minimal level of the distortion in each of the sets. Additionally or alternatively, storing the data includes encoding the data with an Error Correction Code (ECC), reading the second storage values includes reading multiple sets of the second storage values using respective, different read thresholds, and canceling the distortion includes combining the multiple sets of the second storage values responsively to the third storage values to produce soft metrics, so as to enable decoding of the ECC using the soft metrics.

In a disclosed embodiment, receiving the request includes receiving from the memory controller a notification regarding a failure to reconstruct the data in the presence of the distortion. In an embodiment, reading the third storage values and canceling the distortion includes:

initially reading the third storage values from only some of the analog memory cells in the second group and canceling the distortion based on the initially-read third storage values; and responsively to a failure of the memory controller to reconstruct the data, reading at least one additional third storage value from at least one additional analog memory cell in the second group, and re-canceling the distortion responsively to the read third storage values, including the at least one additional third storage value.

In another embodiment, canceling the distortion includes accepting one or more parameters from the memory controller, and canceling the distortion responsively to the parameters.

There is also provided, in accordance with an embodiment of the present invention, a method for data storage, including:

storing data in a memory device including a plurality of analog memory cells that are fabricated on a first semiconductor die by writing first storage values to a group of the analog memory cells;

after storing the data, reading from the memory cells in the group second storage values;

performing a preprocessing operation on the read second storage values by processing circuitry that is fabricated on the first semiconductor die, so as to produce preprocessed data;

providing the preprocessed data to a memory controller, which is fabricated on a second semiconductor die that is different from the first semiconductor die, so as to enable the memory controller to reconstruct the data responsively to the preprocessed data;

accepting in the processing circuitry feedback from the memory controller regarding reconstruction of the data; and modifying the preprocessing operation of the processing circuitry responsively to the feedback.

In some embodiments, the feedback includes information regarding past usage of read thresholds.

There is further provided, in accordance with an embodiment of the present invention, a method for data storage, including:

storing data in a memory device including a plurality of analog memory cells by writing first storage values to a group of the analog memory cells;

after storing the data, receiving in the memory device a request from a memory controller to retrieve the data;

responsively to the request, reading from the memory cells in the group second storage values, and invoking an auxiliary computation unit to preprocess the second storage values to produce preprocessed data; and providing the preprocessed data to the memory controller, so as to enable the memory controller to reconstruct the data responsively to the preprocessed data.

There is also provided, in accordance with an embodiment of the present invention, a method for data storage, including:

storing data in a memory device that includes a plurality of analog memory cells by writing first storage values to a group of the analog memory cells;

after storing the data, receiving in the memory device a request from a memory controller to retrieve the data;

accepting in the memory device one or more analog control signals, which are produced and applied by the memory controller so as to specify voltages or currents that are to be used by the memory device in retrieving the data from the analog memory cells;

responsively to the request, setting the specified voltages or currents, and reading from the memory cells in the group second storage values using the set voltages or currents; and providing the second storage values to the memory controller, so as to reconstruct the data.

There is further provided, in accordance with an embodiment of the present invention, a memory device, including:

a first semiconductor die;

a plurality of analog memory cells, which are fabricated on the first semiconductor die; and processing circuitry, which is fabricated on the first semiconductor die and is operative to store data in the plurality of the analog memory cells by writing input storage values to a group of the analog memory cells, to read, after storing the data, multiple output storage values from each of the analog memory cells in the group using respective, different threshold sets of read thresholds, thus providing multiple output sets of the output storage values corresponding respectively to the threshold sets, to preprocess the multiple output sets of the output storage values so as to produce preprocessed data, and to provide the preprocessed data to a memory controller that is fabricated on a second semiconductor die different from the first semiconductor die, so as to reconstruct the data stored in the group of the analog memory cells responsively to the preprocessed data.

There is additionally provided, in accordance with an embodiment of the present invention, a memory device, including:

a first semiconductor die;

a plurality of analog memory cells, which are fabricated on the first semiconductor die; and processing circuitry, which is fabricated on the first semiconductor die and is operative to store data in the plurality of analog memory cells by writing first storage values to a first group of the analog memory cells, to read from the memory cells in the first group, after storing the data, second storage values, at least some of which differ from the respective first storage values due to distortion, to receive from a memory controller, which is fabricated on a second semiconductor die different from the first semiconductor die, a request to cancel the distortion in the second storage values, to read responsively to the request third storage values from a second group of the analog memory cells, and to cancel the distortion in the second storage values based on the third storage values, so as to enable the memory controller to reconstruct the data.

There is also provided, in accordance with an embodiment of the present invention, a memory device, including:

a first semiconductor die;

a plurality of analog memory cells, which are fabricated on the first semiconductor die; and processing circuitry, which is fabricated on the first semiconductor die and is operative to store data in the plurality of analog memory cells by writing first storage values to a group of the analog memory cells, to read second storage values from the memory cells in the group after storing the data, to perform a preprocessing operation on the read second storage values so as to produce preprocessed data, to provide the preprocessed data to a memory controller fabricated on a second semiconductor die that is different from the first semiconductor die so as to enable the memory controller to reconstruct the data responsively to the preprocessed data, to accept feedback from the memory controller regarding reconstruction of the data, and to modify the preprocessing operation responsively to the feedback.

There is further provided, in accordance with an embodiment of the present invention, a data storage apparatus, including:

a memory device, including:

a plurality of analog memory cells; and processing circuitry, which is operative to store data by writing first storage values to a group of the analog memory cells, and to retrieve the data by reading second storage values from the analog memory cells in the group; and an auxiliary computation unit, which is coupled to pre-process the second storage values read from the analog memory cells to produce preprocessed data, wherein the processing circuitry is operative to receive, after storing the data, a request from a memory controller to retrieve the data, to read the second storage values from the memory cells in the group responsively to the request, to invoke the auxiliary computation unit to preprocess the read second storage values so as to produce the preprocessed data, and to provide the preprocessed data to the memory controller.

There is additionally provided, in accordance with an embodiment of the present invention, a memory device, including:

a plurality of analog memory cells; and processing circuitry, which is operative to store data by writing first storage values to a group of the analog memory cells, to receive, after storing the data, a request from a memory controller to retrieve the data, to accept from the memory controller one or more analog control signals, which specify voltages or currents that are to be used by the processing circuitry in retrieving the data from the analog memory cells, to set the specified voltages or currents responsively to the request, to read from the memory cells in the group second storage values using the set voltages or currents, and to provide the second storage values to the memory controller.

The present invention will be more fully understood from the following detailed description of the embodiments thereof, taken together with the drawings in which:

BRIEF DESCRIPTION OF THE DRAWINGS

FIG. 3 is a flow chart that schematically illustrates a method for operating a memory device having an internal signal processing unit, in accordance with an embodiment of the present invention;

FIGS. 4 and 5 are flow charts that schematically illustrate methods for retrieving data from a memory device, in accordance with embodiments of the present invention;

DETAILED DESCRIPTION OF EMBODIMENTS

Overview

Figure 1:
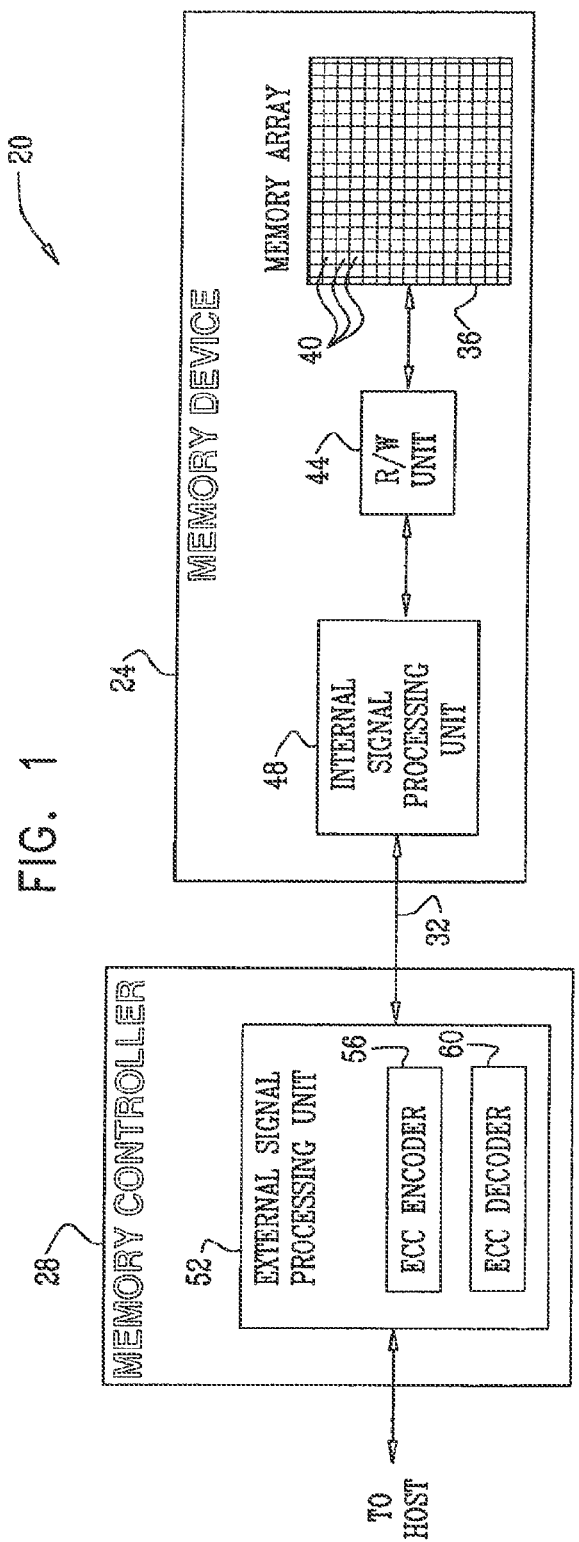
FIG. 1 is a block diagram that schematically illustrates a memory system, in accordance with an embodiment of the present invention.

Various signal processing tasks may be performed on the storage values read from analog memory cells, such as computation of soft metrics for decoding based on Error Correction Coding (ECC), adjustment of read thresholds, and/or estimation and canceling of interference. Such signal processing tasks often involve performing multiple read operations, either on the same group of cells or on different cell groups, and processing the read data. In many practical cases, however, the amount of data produced by the multiple read operations is extremely large.

Transferring such large amounts of data to an external memory controller that resides on another semiconductor die may significantly reduce the throughput and latency of data storage and retrieval. Some high-speed interfaces require a large number of Input/Output (I/O) pins, which increases the size, cost and complexity of the memory device and controller. Other high-speed interfaces use fewer I/O pins but operate at high clock rates, which may increase the power consumption of the interface and the power dissipation of the memory device and controller.

In view of the difficulties associated with high-speed interfaces, embodiments of the present invention provide improved methods and systems for memory signal processing, in which some signal processing functions are performed by circuitry that is fabricated on the same semiconductor die as the memory cells. In some embodiments that are described hereinbelow, a memory system comprises a memory device that is connected by a bus to a memory controller. The memory controller and memory device are fabricated on different dies, and sometimes in different packages.

The memory device comprises an array of analog memory cells and an internal signal processing unit, which is fabricated on the same die as the memory array. The memory controller comprises another signal processing unit, which is referred to herein as an external signal processing unit. The signal processing functions of the system are partitioned between the internal and external signal processing units so as to reduce the amount of data that is transferred over the bus. Since the internal signal processing unit and the memory array are fabricated on the same die, the interconnection between them can be fast and parallel, and does not suffer from the above-mentioned disadvantages of high-speed interconnection between dies.

In some embodiments, the internal signal processing unit performs multiple read operations on a given group of cells using multiple, different read thresholds. The internal signal processing unit preprocesses the storage values read in the multiple read operations, so as to produce preprocessed data. The preprocessed data is then provided to the memory controller for further processing. For example, the internal signal processing unit may read a given memory page multiple times using different thresholds, compute soft ECC metrics based on the multiple read results, and provide the metrics to the memory controller. The memory controller decodes the ECC using the soft metrics.

As another example, the internal processing unit may compute or estimate a statistical property (e.g., histogram) of the storage values over a given group of cells based on the multiple read results, and provide the statistical property to the memory controller. Further alternatively, the internal signal processing unit may read a given target page, as well as one or more other pages that potentially cause interference to the target page. The internal signal processing unit cancels the interference based on the multiple read results, and provides the corrected read results of the target page to the memory controller. The internal signal processing unit may also adjust the read thresholds used for reading a group of memory cells based on the multiple read results.

In some embodiments, internal signal processing (e.g., interference cancellation or soft metric calculation) is performed only in response to a failure of the memory controller to reconstruct the data stored in the cells. For example, the memory controller may notify the memory device of a failure in the ECC decoding process and request that interference cancellation be performed. In alternative embodiments, the internal signal processing unit operates irrespective of the success or failure of data reconstruction.

In some embodiments, signal processing results are provided to the memory controller incrementally, so as to reduce the latency associated with the multiple read results. For example, the internal signal processing unit may initially provide the memory controller with hard decoding metrics that are produced by a single read operation, and perform additional read operations to produce soft metrics only upon failure of the memory controller to reconstruct the data. As another example, the internal signal processing unit may perform interference cancellation by reading potentially-interfering cells only when data reconstruction fails.

Thus, the methods and systems described herein enable memory storage systems to apply advanced and complex signal processing functions. Memory devices and controllers that use the disclosed methods can provide superior performance and capacity at lower cost, without compromising data throughput or latency.

System Description

FIG. 1 is a block diagram that schematically illustrates a memory system 20, in accordance with an embodiment of the present invention. System 20 can be used for data storage and retrieval in various host systems and devices, such as in computing devices, cellular phones or other communication terminals, removable memory modules ("disk-on-key" devices), digital cameras, music and other media players and/or any other system or device in which data is stored and retrieved.

System 20 comprises a memory device 24, which is controlled by a memory controller 28 over a bus 32 or other suitable interface. The memory controller sends commands and data for storage to the memory device, and reads retrieved data and status information from the memory device.

Memory controller 28 and memory device 24 are fabricated on separate semiconductor dies. In some embodiments, the memory device and memory controller reside in separate Integrated Circuits (ICs). In these embodiments, bus 32 interconnects the two ICs. In other embodiments, the memory device and memory controller reside on different dies in a single package, such as in a Multi-Chip Package (MCP) or System on Chip (SoC). In these embodiments, bus 32 interconnects the two dies. In some embodiments, a single memory controller 28 may control multiple memory devices 24. In some configurations, multiple memory controllers may control any desired number of memory devices.

In any of the configurations described above, bus 32 is often the bottleneck that limits the overall data throughput (i.e., storage and/or retrieval speed) of the system. The system limitations imposed by the bandwidth of bus 32 are particularly severe when the bus interconnects multiple memory controllers and/or multiple memory devices. High bandwidth buses that interconnect different dies or ICs are often technologically difficult to achieve. As will be shown in detail below, the methods and systems that are disclosed herein partition some of the signal processing tasks of system 20 between the memory device and the memory controller, in a way that reduces the data throughput over bus 32.

In device 24, data is stored in a memory cell array 36. The memory array comprises multiple analog memory cells 40, which are fabricated on a semiconductor die. In the context of the present patent application and in the claims, the term "analog memory cell" is used to describe any memory cell that holds a continuous, analog value of a physical parameter, such as an electrical voltage or charge. Array 36 may comprise analog memory cells of any kind, such as, for example, NAND, NOR and CTF Flash cells, PCM, NROM, FRAM, MRAM and DRAM cells. The charge levels stored in the cells and/or the analog voltages or currents written into and read out of the cells are referred to herein collectively as analog values or storage values.

System 20 stores data in the analog memory cells by programming the cells to assume respective memory states. The memory states are selected from a finite set of possible states, and each state corresponds to a certain nominal analog value. For example, a 2 bit/cell MLC can be programmed to assume one of four possible memory states by writing one of four possible nominal analog values into the cell. Memory device 24 comprises a reading/writing (R/W) unit 44, which writes storage values into cells 40 and reads storage values from the cells. Reading a storage value from a cell typically comprises comparing the storage value to one or more read thresholds, and determining the data stored in the cell based on the comparison results. The comparison results are also referred to herein as read results.

The memory cell array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages.

The processing of storage values that are read from array 36 is partitioned between an internal signal processing unit 48 that is fabricated on the same semiconductor die as array 36, and an external signal processing unit 52 in memory controller 28. Several possible partitions and associated methods are described in FIGS. 3-8 below. Generally speaking, the internal signal processing unit preprocesses the storage values that are read from the cells and sends the preprocessed data over bus 32 to the external signal processing unit. The external signal processing unit completes the processing task to reconstruct the stored data. Since the volume of preprocessed data is considerably lower than that of the storage values read from the cells, the partitioning of signal processing tasks between the internal and external units considerably reduces the throughput over bus 32, with respect to a configuration in which most of the processing is performed in the memory controller.

In some embodiments, the external signal processing unit encodes the data to be written into the memory cells using an Error Correction Code (ECC), and decodes the ECC of the retrieved data. In these embodiments, unit 52 comprises an ECC encoder 56 that encodes the data prior to storage in device 24, and an ECC decoder 60 that decodes the data retrieved from device 24. The ECC may comprise, for example, a Bose-Chaudhuri-Hocquenghem (BCH) code, a Low Density Parity Check (LDPC) code or any other suitable type of ECC known in the art.

The configuration of FIG. 1 is an exemplary system configuration, which is shown purely for the sake of conceptual clarity. Any other suitable configuration can also be used. Elements that are not necessary for understanding the principles of the present invention, such as various interfaces, addressing circuits, timing and sequencing circuits and debugging circuits, have been omitted from the figure for clarity. As noted above, the circuitry of the internal signal processing unit resides on the same die on which memory array 40 is disposed. In some embodiments, some or all of the functionality of the external signal processing unit can be implemented in software and carried out by a processor or other element of the host system.

Figure 2:
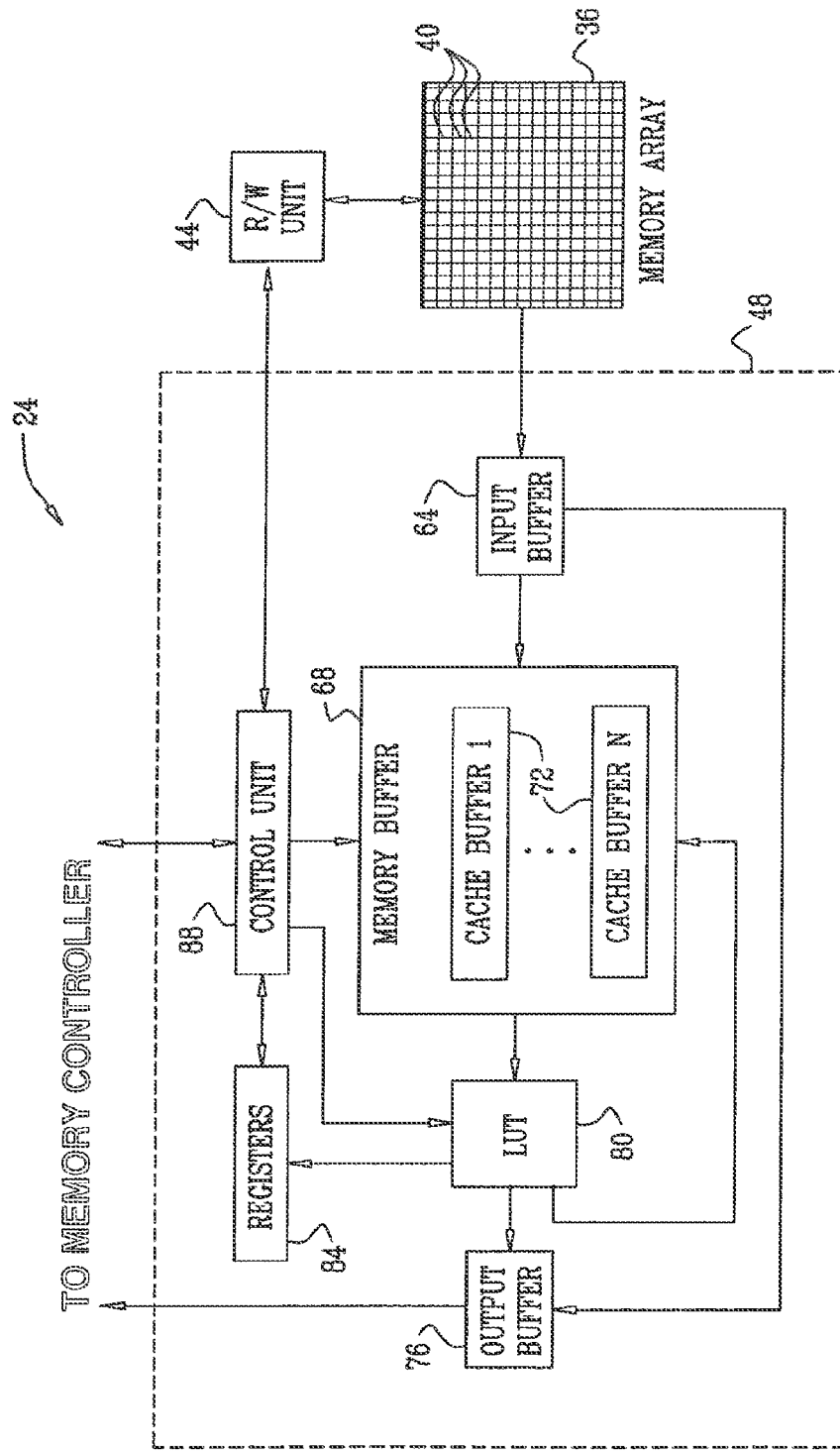
FIG. 2 is a block diagram that schematically illustrates a memory device having an internal signal processing unit, in accordance with an embodiment of the present invention.

FIG. 2 is a block diagram that schematically illustrates the structure of internal signal processing unit 48, in accordance with a non-limiting exemplary embodiment of the present invention. Unit 48 comprises several memory buffers, typically implemented in Random Access Memory (RAM). An input buffer 64 stores data that is retrieved from the memory cells prior to processing. A memory buffer 68 comprises multiple cache buffers 72, which cache data that is used in computations performed by unit 48. An output buffer 76 stores the preprocessed data produced by unit 48. The output buffer is read by the memory controller.

In the embodiments described herein, unit 48 processes entire memory pages that are read from array 36. Accordingly, each of buffers 64, 72 and 76 is dimensioned to store a single memory page. However, the methods and systems described herein are in no way limited to operating on pages and can be used to process data read from any other suitable groups of memory cells, such as sectors. In such embodiments, the different memory buffers are dimensioned according to the size of the memory cell groups that are processed by unit 48. In some embodiments, the buffers may store data that is retrieved from non-consecutive memory cells.

Unit 48 comprises a Look-Up Table (LUT) 80 and a control unit 88, which jointly carry out computations on pages that were fetched from array 36 and cached in buffers 64, 72 and/or 76. Control unit is able to read the data stored in the buffers 64, 72 and 76, and to access (index) the LUT using this data. In a typical preprocessing operation, control unit 88 instructs R/W unit 44 to fetch the appropriate pages from array 36 into input buffer 64 and copies the fetched pages to cache buffers 72. LUT 80 is accesses with one or more of the pages cached in buffers 72, and possibly by the page stored in input buffer 64, to produce a result. The result (i.e., the LUT output) is placed in output buffer 76 and is read by the memory controller. Additionally or alternatively, the LUT output may be stored in one of cache buffers 72 for subsequent processing.

When moving a memory page from input buffer 64 to one of cache buffers 72, control unit 88 may perform various logical operations on the page. For example, the control unit may perform bit-wise operations such as a NOT operation, a XOR, AND or OR operation with respect to a given mask, a shift or rotate operation, or any other suitable operation.

Higher-complexity operations, as well as operations that involve more than a single page, are performed using LUT 80. The LUT may be accessed (indexed) by one or more pages, which are stored in any of buffers 72 and/or in input buffer 64. In some embodiments, the LUT coefficients are fixed. Alternatively, the coefficients may be loaded from the memory controller, e.g., at initialization or during operation. Thus, the LUT coefficients may be adapted or otherwise modified during operation of unit 48.

In some embodiments, control unit 88 performs operations on the LUT output and stores the result in registers 84. Such operations may comprise, for example, counting the number of occurrences of a given bit value or bit pattern in the LUT output, performing XOR between two bytes or words in the LUT output, or any other suitable operation.

Control unit 88 receives commands from memory controller 28, and carries out computations in response to the commands. The commands are drawn from a predefined command set that is supported by the control unit and by the memory controller. In some embodiments, the command set comprises high-level commands such as "Read page X," "Read page X and cancel interference from pages P1 . . . PN," "Compute soft metrics for page X," "Read histogram of group Y of memory cells," or "Set the read thresholds to values T1 . . . TN." Alternatively, the command set may comprise low-level atomic commands such as commands to perform Copy, NOT, XOR, Shift or shift operations, and commands for loading LUT coefficients. In these embodiments, the high-level functionality of unit 48 is managed and controlled by memory controller 28. In some embodiments, the command set may comprise a combination of atomic and high-level commands.

An atomic command may have a format such as {Command, $SRC_1 \ldots SRC_N$, $DEST_1 \ldots DEST_M$, $DATA_1 \ldots DATA_K$}, wherein Command denotes an op-code that specifies the requested low-level operation, $SRC_1 \ldots SRC_N$ and $DEST_1 \ldots DEST_M$ specify sources and destinations of the data used in the operation (e.g., buffers 64, 72 and 76, registers 84, the LUT output), and $DATA_1 \ldots DATA_K$ specify data to be used in the operation (e.g., LUT coefficients to be loaded or a number of shifts to be applied to the data). Alternatively, any other suitable format can also be used.

The configuration of unit 48 shown in FIG. 2 is an exemplary configuration, which is chosen purely for the sake of conceptual clarity. In alternative embodiments, any other suitable configuration can also be used. For example, buffers 64, 72 and 76 may be integrated into a single unit. As another example, unit 48 may comprise two or more LUTs.

In the description above, unit 48 preprocesses the read storage values by performing LUT operations, such as different logical functions. In alternative embodiments, however, unit 48 may perform higher-complexity operations when preprocessing the storage values. For example, unit 48 may comprise circuitry that performs arithmetic operations, such as addition or multiplication, on the read storage values. Performing such arithmetic operations can be useful, for example, in computing soft ECC metrics.

In some embodiments, unit 48 and R/W unit 44 may be integrated in a single unit. In the context of the present patent application and in the claims, units 44 and 48 are regarded jointly as a processing circuit that is attached to the memory cell array and performs reading and writing functions, as well as signal processing functions that are described in detail below.

Preprocessing of Read Pages Using Internal Signal Processing Unit

Various signal processing tasks in system 20 involve performing multiple read operations and operating on the read data to produce a result. Multiple read operations are performed, for example, when computing soft metrics for ECC decoding, when adjusting read thresholds and/or when estimating and canceling interference in a given memory page. In some embodiments of the present invention, internal signal processing unit 48 preprocesses the read data and provides a reduced-throughput result to memory controller 28.

FIG. 3 is a flow chart that schematically illustrates a method for operating a memory device having an internal signal processing unit, in accordance with an embodiment of the present invention. The general method description applies to any of the signal processing tasks described above. Specific examples of each type of task are described in FIGS. 4-8 below. The method of FIG. 3 begins with device 24 performing multiple read operations, at a multiple reading step 90. The multiple read operations may be applied to the same group of cells or to different groups, and may use the same read thresholds or different thresholds, as appropriate.

In a typical flow, control unit 88 instructs R/W unit 44 to perform the multiple read operations and provides unit 44 with the appropriate addresses, threshold values and/or other operation attributes. Unit 44 reads the requested memory pages into input buffer 64, and control unit 88 copies the read pages into cache buffers 72.

Unit 48 preprocesses the multiple read pages, at a preprocessing step 94, to produce preprocessed data. Preprocessing is applied by control unit 88, using LUT 80. Unit 48 provides the preprocessed data to memory controller 28, at a preprocessing output step 98. The memory controller obtains and processes the preprocessed data provided by unit 48, at a controller processing step 102.

The preprocessing result is placed in output buffer 76, where it is available for reading by memory controller 28. Providing the preprocessed data to the memory controller may be passive or active. In other words, unit 48 may send the preprocessing results to the memory controller 28 over bus 32 in a suitable command, or it may place the results in the output buffer and enable the memory controller to access the buffer.

The number and type of pages (or parts of pages) that are read by unit 48, the type of preprocessing performed by unit 48, the type of preprocessed data conveyed over bus 32 and the specific processing performed by the memory controller vary from one task type to another. For example, when computing soft ECC metrics for a given memory page, unit 48 reads the page multiple times using different read thresholds, computes the soft metrics based on the read data, and provides the soft metrics to the memory controller. The memory controller decodes the ECC using the metrics. As another example, when canceling interference in a given page, unit 48 reads the given page and a set of potentially-interfering pages, estimates and cancels the distortion, and provides corrected data to the memory controller. The memory controller applies ECC decoding to the corrected data and outputs the decoded data.

As can be appreciated from these examples, the volume of preprocessed data is considerably smaller than the volume of the raw data of the memory pages read from the memory cells. Thus, the data throughput over bus 32 is considerably lower, in comparison to a configuration in which the raw data is provided to the memory controller.

Soft Metric Computation

In some system configurations, the data stored in memory device 24 is encoded with an ECC prior to its storage in the memory cells. ECC decoders often operate on soft metrics, which are indicative of the quality or confidence levels of the storage values read from the cells. In some embodiments, unit 48 in memory device 24 computes soft metrics of the storage values read from a given page by performing multiple read operations, and provides the metrics to the memory controller. ECC decoder 60 in the memory controller decodes the ECC using the metrics, so as to reconstruct the stored data. Thus, instead of providing the raw data (the storage values read from the cells), device 24 provides the soft metrics to the memory controller. As a result, the data throughput over bus 32 is considerably reduced.

Certain aspects of reading memory cells using multiple thresholds and of computing soft ECC metrics based on such read operations are described in PCT International Publication WO 2007/132457, cited above, and in U.S. patent application Ser. No. 11/995,814, entitled "Reading Memory Cells using Multiple Thresholds," filed Jan. 15, 2008, whose disclosure is incorporated herein by reference.

FIG. 4 is a flow chart that schematically illustrates a method for retrieving data from memory device 24, in accordance with an embodiment of the present invention. The method begins with ECC encoder 56 in memory controller 28 encoding a page of data with an ECC, at an encoding step 110. The memory controller sends the encoded page for storage in device 24 over bus 32.

When device 24 is requested by memory controller 28 to retrieve the page, unit 48 reads the page multiple times using different read thresholds, at a multiple read step 114. Reading a given group of memory cells multiple times with different thresholds provides higher-resolution information regarding the storage values of the cells. Therefore, soft ECC decoding (i.e., decoding that is based on soft metrics) typically provides superior performance in comparison with hard decoding.

Unit 48 computes soft metrics for the different data bits stored in the cells of the page in question, at a metric calculation step 118. (The description that follows refers to single-level cells that store one bit per cell. A single read operation on such a cell typically comprises a single comparison to a certain threshold. The methods described herein can be generalized in a straightforward manner to MLC devices that store multiple bits per cell—as described further below.)

For a given cell, each read operation produces a comparison result, i.e., an indication of whether the storage value of the cell is above or below the read threshold used in the operation. In other words, each read operation that uses a give threshold returns a "1" or "0" value, depending on the result of comparing the storage value of the cell to the threshold. Thus, when performing N read operations on a given cell using N different thresholds, N comparison results are obtained for each cell.

Control unit 88 in unit 48 processes the multiple comparison results obtained for each cell to produce a corresponding soft metric for that bit. The mapping of each combination of comparison results to the corresponding soft metric value can be performed using LUT 80, by performing majority voting, or using any other suitable technique. Several exemplary metrics and computation techniques are described in U.S. patent application Ser. No. 11/995,814, cited above.

Unit 48 provides the computed soft metric values to memory controller 28 over bus 32, at a metric output step 122. In some embodiments, unit 48 sends all metrics to the memory controller. Alternatively, the memory controller may request only specific metrics to be provided. Further alternatively, unit 48 may send only specific metrics to the memory controller, with appropriate indexing that enables the memory controller to associate each metric with the corresponding bit or cell.

In some embodiments, unit 48 provides soft metrics only upon a failure of the memory controller to reconstruct the data (e.g., upon failure to decode the ECC). In these embodiments, the memory controller initially attempts to reconstruct the data based on hard metrics provided by unit 48 (i.e., based on a single comparison result for each cell). If the memory controller is unable to decode the ECC successfully, it notifies unit 48 of the failure. In response to the notification, unit 48 provides soft metrics to the memory controller (or refines the hard metrics with additional information that enables the memory controller to produce soft metrics). An exemplary process of this sort is described in FIG. 5 below. In alternative embodiments, unit 48 provides soft metrics regardless of the success or failure of the memory controller to reconstruct the data. In these embodiments, the memory controller may choose whether, and to what extent, to use the soft metrics provided by unit 48.

Memory controller 28 receives the soft metrics provided by unit 48 of memory device 24. ECC decoder 60 in the memory controller decodes the ECC by processing the soft metrics, and reconstructs the data, at an ECC decoding step 126.

FIG. 5 is a flow chart that schematically illustrates another method for retrieving data from a memory device, in accordance with an alternative embodiment of the present invention. In the method of FIG. 5, unit 48 initially provides a hard (1-bit) comparison result for each read bit, obtained by reading the page using a single threshold. Additional comparison results, which are obtained by performing additional read operations with different thresholds, are provided only when the memory controller is unable to reconstruct the data successfully.

The method of FIG. 5 begins with memory controller 28 requesting memory device 24 to read a certain page, at a page requesting step 130. Unit 48 reads the requested page using a first threshold and caches the comparison results in one of the cache buffers, at a first reading step 134. At this point, units 48 and 44 carry out two processes in parallel: (1) provide the 1-bit comparison results (hard metrics) to the memory controller in order to initiate ECC decoding, and (2) re-read the page using additional thresholds in order to obtain additional comparison results.

Memory controller 28 reads the 1-bit comparison results of the page from memory device 24, at a hard input step 138. ECC decoder 60 attempts to decode the ECC using the 1-bit comparison results (hard metrics), at a hard decoding step 142. If hard decoding is successful, as checked by a success checking step 146, the memory controller reconstructs and outputs the data, at an output step 150.

In parallel with steps 138-146, unit 48 re-reads the page using additional thresholds, so as to obtain additional comparison results that are subsequently used to compute soft metrics. In the present example, unit 48 re-reads the page two more times using two additional thresholds, at respective second and third reading steps 154 and 158. Unit 48 caches the additional comparison results in cache buffers 72.

Based on the two additional sets of comparison results, unit 48 produces an additional bit of information per cell, which is referred to as refinement information, at a refinement calculation step 162. Typically, the refinement information bit also depends on the initial set of 1-bit comparison results that were read at step 134. Control unit 88 may compute the refinement information using LUT 80, which operates on the comparison results stored in cache buffers 72. An example of a LUT that can be used for mapping the three sets of comparison results to corresponding refinement information is given in the following table:

| $1^{st}$ read comparison result | $2^{nd}$ read comparison result | $3^{rd}$ read comparison result | Refinement information |
| --- | --- | --- | --- |
| 1 | 1 | 1 | 1 |
| 1 | 0 | 1 | 0 |
| 0 | 0 | 0 | 0 |
| 0 | 0 | 1 | 1 |

Returning now to success checking step 146, if the memory controller is unable to reconstruct the data successfully using the 1-bit comparison results, the memory controller reads the refinement information from the memory device, at a refinement step 166. The memory controller computes soft metrics based on the refinement information. ECC decoder 60 re-attempts to decode the ECC using the soft metrics, at a soft decoding step 170. The performance of soft decoding is typically superior to hard decoding; therefore there is a high likelihood that soft ECC decoding will succeed. The memory controller reconstructs and outputs the decoded data, at output step 150.

The method of FIG. 5 combines low latency with high decoding performance. When 1-bit (hard) ECC decoding is sufficient, the memory controller is able to perform hard decoding and reconstruct the data without having to tolerate the latency associated with the additional read operations. On the other hand, soft metrics are available when soft decoding is necessary.

The method of FIG. 5 is an exemplary method for providing information that incrementally increases in resolution from the memory device to the memory controller. Various different variations of the method can be used. For example, the initial data provided by the memory device may comprise soft data, i.e., may have a resolution of more than a single bit. Although FIG. 5 shows a single step of incrementing the resolution, the memory device may perform any desired number of iterations. In each iteration, the number of thresholds may increase by any desired number, which may or may not be the same for all iterations.

In the example of FIG. 5, the memory controller performs the additional read operations regardless of whether the memory controller will request the additional information or not. Alternatively, the memory controller may perform additional re-read operations only when requested by the memory controller, e.g., when ECC decoding of the previous iteration failed. The refinement information calculated by unit 48 is viewed as a kind of soft metric that is provided to memory controller 28. Alternatively to providing refinement information, the memory device may compute the soft metrics based on an incrementally-increasing number of comparison results, and provide the metrics to the memory controller.

In many cases, read pages are likely to be decoded successfully using hard metrics, e.g., after step 142. Therefore, in some embodiments, the memory controller may request the memory device to read the next page in parallel with, or even before receiving and processing the soft metrics of the previous page. In other words, the memory controller may run multiple instances of the method of FIG. 5 in semi-parallel, assuming that most of the pages will be decoded successfully and will not require the use of soft metrics.

The examples of FIGS. 4 and 5 refer to the use of a single threshold per read operation per cell, as is commonly performed in SLC devices. This configuration was chosen purely for the sake of conceptual clarity. The methods of FIGS. 4 and 5 can similarly be used in MLC devices, by using a different set of thresholds in each of the multiple read operations.

In some embodiments, the stored data is encoded with an Error Detection Code (EDC), such as a Cyclic Redundancy Check (CRC), either in addition to or instead of an ECC. In the present context, an EDC is regarded as a kind of ECC.

Measurement of Storage Value Distribution

Various signal processing tasks performed in memory devices involve calculating or estimating statistical properties of the storage values in a given group of memory cells. Statistical properties may comprise, for example, scalar values such as the mean storage value or the variance of the storage value distribution over a given group of cells (typically a page). Other statistical properties may comprise the number of cells in the group whose storage value is within a given range of values (e.g., above a given value, below a given value or between a given pair of values). Other statistical properties may comprise estimates of statistical functions, such as a Probability Density Function (PDF), a histogram, a Cumulative Distribution Function (CDF), an inverse CDF ($CDF^{-1}$) or any other suitable statistical function defined over the storage values of a given group of cells.

For example, CDF estimation can be used for optimal adjustment of read thresholds used for reading the cells. PCT Application PCT/IL2008/000329, entitled "Adaptive Estimation of Memory Cell Read Thresholds," filed Mar. 11, 2008, whose disclosure is incorporated herein by reference, describes exemplary methods for adjusting read thresholds using CDF estimation.

In some embodiments, unit 48 performs multiple read operations on a given page using different thresholds, and calculates one or more statistical properties of the storage values of the cells in the page. Unit 48 then provides the calculated statistical properties to memory controller 28 over bus 32. Such a configuration provides a considerable reduction in the throughput over bus 32, in comparison with a configuration in which the statistical properties are calculated by the memory controller.

Figure 6:
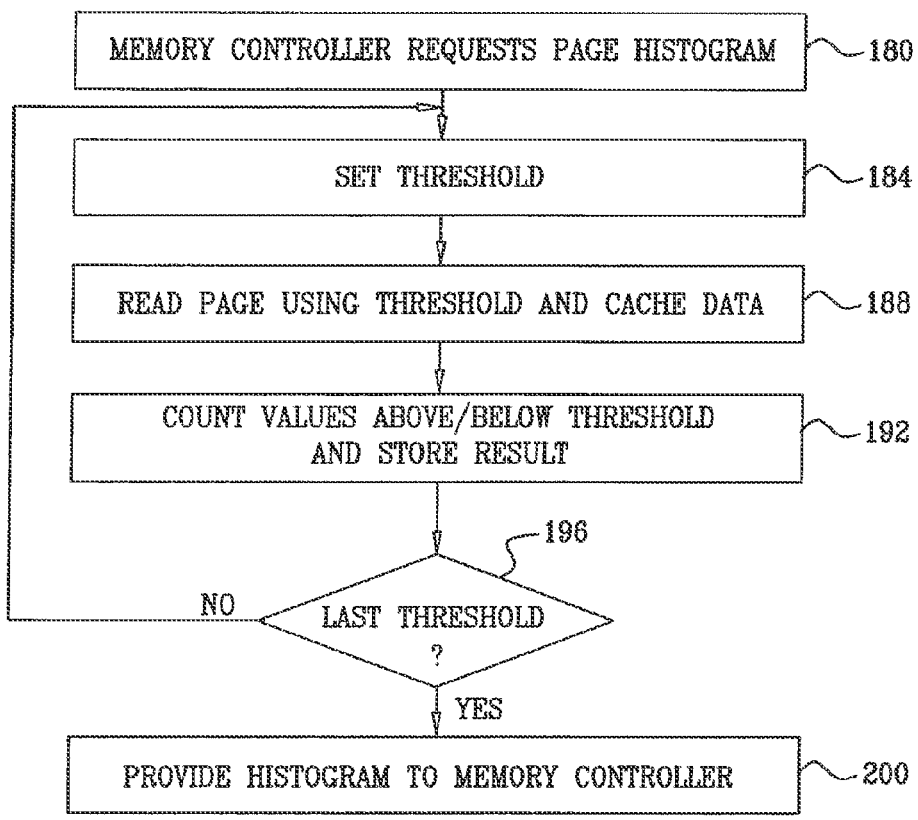
FIG. 6 is a flow chart that schematically illustrates a method for computing a page histogram, in accordance with an embodiment of the present invention.

FIG. 6 is a flow chart that schematically illustrates a method for computing a page histogram, in accordance with an embodiment of the present invention. The storage values of the cells in a given page lie within a certain range. In the present example, unit 48 computes the page histogram by defining a grid of thresholds that covers the possible range of storage values, reading the page multiple times using the different thresholds in the set, and counting the number of cells whose storage values fall between each pair of adjacent thresholds. Other functions, e.g., CDF or $CDF^{-1}$, can be computed by counting the number of cells whose storage values are higher or lower than each of the thresholds.

The method begins with memory controller 28 requesting memory device 24 to compute a histogram of the storage values in a given page, at a histogram requesting step 180. In some embodiments, the memory controller notifies the memory device of the possible range of storage values in the page, a range and/or number of thresholds to be used in computing the histogram, or even the actual set of thresholds to be used. Alternatively, some or all of these values may be predefined or determined by the memory device. In some embodiments, the memory controller may request that the histogram be computed on any desired group of cells, which may span part of a page or multiple pages. In these embodiments, the desired group of cells is specified in the request.

Unit 48 in the memory device instructs R/W unit 44 to set one of the thresholds in the set, at a threshold setting step 184. Typically, unit 48 starts with the lowest or highest threshold in the set, but the process may start with any of the thresholds. The R/W unit reads the page using the set threshold, at a reading step 188. Unit 48 caches the read results, e.g., in one of cache buffers 72. Control unit 88 counts the number of cells whose value is on one side of the threshold (e.g., the cells whose read value is "1"), at a counting step 192. The control unit stores the counting result in registers 84.

Unit 48 checks whether all read operations have been performed, at a last threshold checking step 196. If additional read operations remain, the method loops back to step 184 above, and unit 48 sets the next threshold in the set. If all read operations have been performed, unit 48 computes the histogram and provides the histogram to memory controller 28 at a histogram output step 200.

In some embodiments, unit 48 provides counting results (i.e., the number of cells whose storage values are larger or smaller than each of the thresholds) to memory controller 28. In alternative embodiments, unit 48 computes the number of cells whose storage values fall between each set of adjacent thresholds by subtracting counting results from one another. Unit 48 then provides the computation results to the memory controller.

The method of FIG. 6 demonstrates the technique of computing statistical properties by unit 48. Similar processes can be applied by memory controller 28 and device 24 to compute various other kinds of statistical properties. In some embodiments, the command set defined between the memory controller and the memory device comprises one or more commands that request the memory device to compute and return a given statistical property. The commands may specify the requested statistical property, the group of cells over which the property is to be computed, and/or any other relevant information.

Interference Cancellation

The storage values read from cells 40 are sometimes distorted by cross-coupling of the electric fields from other cells. When reading a certain page (referred to as a target page), the storage values of the cells of the target page may be subject to cross-coupling interference from one or more other pages (referred to as potentially-interfering pages). In some embodiments of the present invention, unit 48 in device 24 estimates and cancels the cross-coupling interference by reading the potentially-interfering pages in addition to reading the target page.

Figure 7:
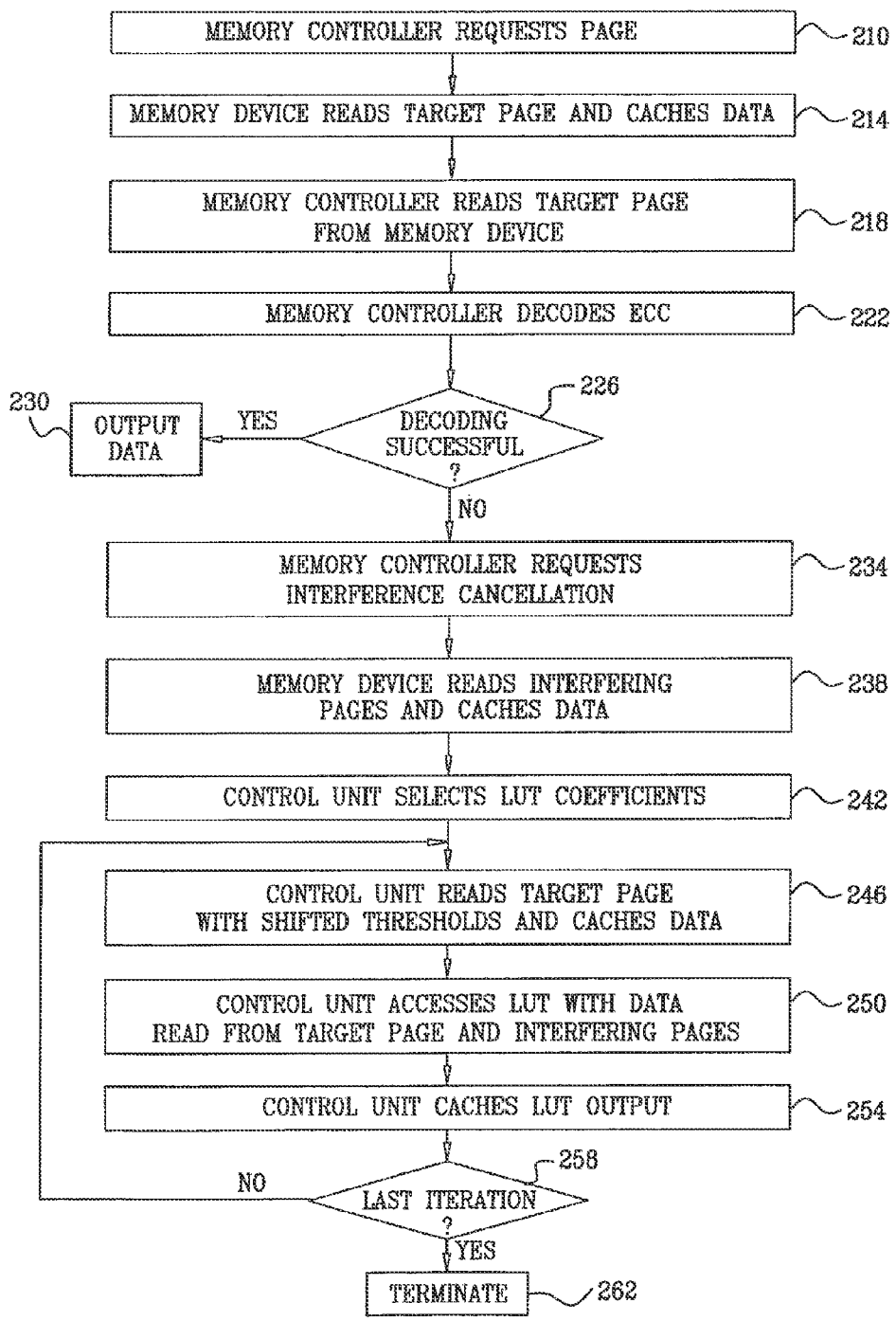
FIG. 7 is a flow chart that schematically illustrates a method for canceling interference in a memory device, in accordance with an embodiment of the present invention.

FIG. 7 is a flow chart that schematically illustrates a method for canceling interference in a memory device, in accordance with an embodiment of the present invention. In the present example, the memory device supports two types of read operations—with and without interference cancellation. When the memory controller requests a certain target page, unit 48 initially reads the page without interference cancellation. If the memory controller is unable to reconstruct the data successfully, unit 48 applies interference cancellation and provides corrected values to the memory controller. In alternative embodiments, interference cancellation may be performed irrespective of the success or failure of the memory controller to reconstruct the data.

The method of FIG. 7 begins with memory controller 28 instructing memory device 24 to read a certain target page, at a requesting step 210. Unit 48 in device 24 reads the target page and provides the results in output buffer 76, at a target reading step 214. The memory controller retrieves the read results from the output buffer, at a retrieving step 218. ECC decoder 60 in the memory device attempts to decode the ECC, at an ECC decoding step 222. If ECC decoding is successful, as checked at a success checking step 226, the memory controller reconstructs and outputs the data, at an output step 230.

Otherwise, i.e., when memory controller 28 is unable to reconstruct the data of the target page, the memory controller requests the memory device to perform interference cancellation, at a cancellation requesting step 234. Interference cancellation is carried out by (1) reading one or more potentially-interfering pages, (2) reading the target page several times using shifted read thresholds, and (3) selecting one of the read results of the target page that minimizes the interference level. The selection, which is typically performed cell-by-cell, is based on the data read from the potentially-interfering pages. Further details of the interference cancellation process are provided in PCT International Publications WO 2007/132453 and WO 2007/132457, cited above.

At step 234, the memory device typically specifies the target page, the potentially-interfering pages and the number of shifted thresholds to be used for reading the target page. In response to the interference cancellation request, unit 48 in device 24 reads the potentially-interfering pages, at an interfering page reading step 238. Unit 48 stores the read results of the interfering pages in cache buffers 72.

LUT 80 holds a set of cross-coupling coefficients, which specify the interference level from different types of neighboring cells to a given interfered cell. For example, when a cell is subject to interference from an upper neighbor, a lower neighbor, a right-hand-side neighbor and a left-hand-side neighbor, each neighbor type has a corresponding cross-coupling coefficient that is stored in the LUT. The coefficients may be estimated by unit 48 or provided by memory controller 28.

In some cases, the coefficients used for canceling interference in a given target page may vary from one page to another. For example, odd-order pages may have different interference patterns than even-order pages. As another example, pages in the first and last row of an erasure block may have different interference than pages in the interior of the block. Thus, in some embodiments, LUT 80 may hold multiple sets of coefficients, or a large coefficient set that covers multiple cases and page types. In these embodiments, control unit 88 of unit 48 selects the cross-coupling coefficients to be used, based on the type of the target page, at a coefficient selection step 242. Alternatively, the cross-coupling coefficients can be provided to unit 48 by the memory controller as part of step 234 above.

Unit 48 now performs multiple iterations of reading the target page, and uses a shifted set of read thresholds in each iteration. Typically although not necessarily, the thresholds used in the different iterations are shifted in gradually-increasing increments around the nominal threshold values, e.g., ±20 mV, ±40 mV, ±60 mV . . . .

In a given iteration, unit 48 reads the target page using a set of shifted read thresholds, at a shifted reading step 246. Unit 48 caches the read results in cache buffers 72. Control unit 88 accesses LUT 80, at a LUT accessing step 250. In some embodiments, the LUT is accessed with (1) the read results of the target page from the previous iteration, (2) the read results of the target page from the current iteration, and (3) the read results of the potentially-interfering pages. The LUT output comprises cell-by-cell decisions, specifying whether to retain the read results of the previous iteration or to select the read results of the current iteration. Unit 48 caches the LUT output in output buffer 76, at an output caching step 254.

Unit 48 checks whether the last iteration has been performed (i.e., whether all shifted thresholds have been used), at an iteration checking step 258. If the iterations have not been completed, the method loops back to step 246 above. Unit 48 advances to the next shifted threshold and the iterative process continues. When all iterations have been performed, the LUT output provides, for each cell, the read result that contains the lowest level of cross-coupling interference out of the read results obtained with the different shifted thresholds. Unit 48 provides the best-performing read results to the memory controller, and the method terminates, at a termination step 262.

Using the method of FIG. 7, interference cancellation is performed internally to the memory device, so that data read from the potentially-interfering pages need not be sent to the memory controller. Therefore, the data throughput over bus 32 is considerably reduced in comparison with a configuration in which interference cancellation is carried out by the memory controller. The extra latency associated with performing the additional read operations is avoided whenever possible, since interference cancellation is invoked only when the memory controller is unable to reconstruct the data of the target page.

In the exemplary embodiment of FIG. 7, interference cancellation is carried out by reading the desired page multiple times with different read thresholds to obtain multiple hard read results, and selecting the best-performing hard result on a cell-by-cell basis. In alternative embodiments, interference cancellation can be performed by combining the multiple read results rather than selecting one of them. For example, multiple read results of a given cell or of a given bit can be combined, according to the estimated interference, to produce a soft ECC metric for this cell or bit. The soft ECC metrics are subsequently used in decoding the ECC. Any suitable type of soft metrics, such as Log Likelihood Ratios (LLRs) can be used for this purpose. Several interference cancellation techniques based on this principle are described in PCT International Publication WO 2007/132457, cited above.

In some embodiments, the command set supported by the memory controller and the memory device comprises one or more commands that request the memory device to read a target page and to cancel the interference to that page. The commands may specify the potentially-interfering pages that should be considered. Additionally or alternatively, the interface between the memory controller and the memory device may comprise a command or other interface, using which the memory controller notifies the memory device whether it was able to successfully reconstruct the data. In these embodiments, the memory device may initiate interference cancellation in response to a notification from the memory device that data reconstruction has failed. Alternatively to a command interface, requests can be sent from the memory controller to the memory device using a dedicated hardware signal.

Various techniques can be used for reducing the latency and computational complexity associated with the additional read operations performed for interference cancellation. For example, when the memory controller requests a target page, the memory device reads the target page without interference cancellation and indicates to the memory controller that the page is ready, such as using a ready/busy signal. While the memory controller reads the target page from the memory device, the memory device reads a subset of the potentially-interfering pages. The memory device applies interference cancellation using the subset of the potentially-interfering pages, as described above. If the memory controller re-reads the target page, for example due to ECC failure, the memory device provides the page with some degree of interference cancellation. The memory device continues to read additional potentially-interfering pages, possibly in parallel to the second read operation, and refines the interference cancellation using the additional pages. If the memory controller re-reads the target page again, it is provided with a page in which the interference cancellation is refined.

In some embodiments, calculation or estimation of the interference cancellation corrections is carried out in the memory controller. In these embodiments, the memory controller sends the appropriate corrections to the memory device, and the memory device applies the corrections when reading the target page. In these embodiments, processing of the multiple read operations carried out for interference cancellation is divided between the memory device and the memory controller. The memory device performs multiple read operations of the target page with different thresholds. The memory controller is provided with the read results of the potentially-interfering pages and computes the interference estimation. The memory controller instructs the memory device which of the multiple read results of a given cell to select, based on the interference estimation. This hybrid configuration provides partial throughput reduction over bus 32, but on the other hand reduces the size and complexity of the LUT and reduces the amount of caching in the memory device.

In some embodiments, after performing interference cancellation, the memory device may send the memory controller corrections to the data that was provided before interference cancellation (at step 218). Such a technique may be advantageous since the throughput of the correction information is considerably smaller than the throughput of providing the entire page. The corrections can be provided iteratively, until ECC decoding is successful. The corrections may comprise corrections to data bits and/or corrections to the storage values (soft values such as floating-point numbers). In some embodiments, the memory device sends corrections pertaining to only a subset of the memory cells. For example, the memory device may send corrections to the memory controller only if the soft value of the correction exceeds a certain threshold. In other words, the memory device may send corrections related only to badly-distorted cells. This technique further reduces the data throughput from the memory device to the memory controller.

Although the method of FIG. 7 refers mainly to distortion of the storage values caused by cross-coupling interference from other cells, the principles of the present invention can also be used to estimate and cancel other types of distortion. For example, unit 48 may estimate and cancel disturb noise caused by memory access operations applied to other cells in the array, aging effects, Back Pattern Dependency distortion and many others. Some distortion mechanisms, and exemplary estimation and cancellation techniques that can be used by unit 48, are described in PCT International Publications WO 2007/132453 and WO 2008/026203, cited above.

Read Threshold Adjustment

Figure 8:
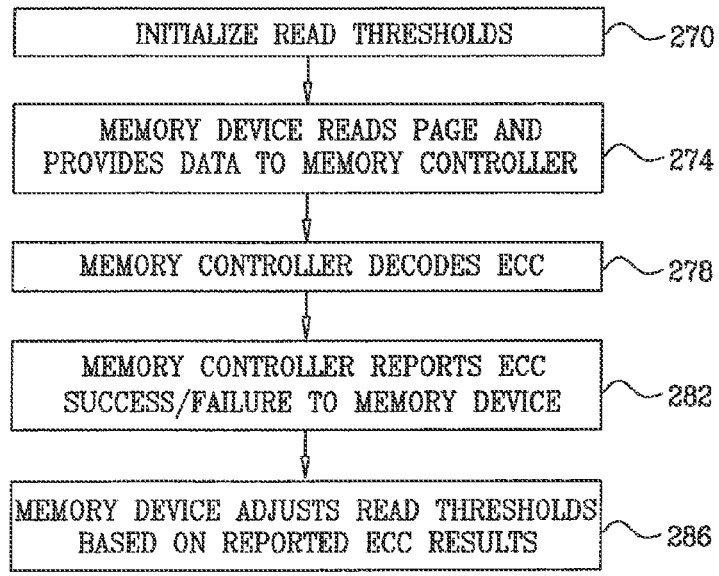
FIG. 8 is a flow chart that schematically illustrates a method for adjusting read threshold used for reading data from a memory device, in accordance with an embodiment of the present invention.

FIG. 8 is a flow chart that schematically illustrates a method for adjusting read threshold used for reading data from a memory device, in accordance with an embodiment of the present invention. The method uses an interface, which is defined between the memory controller and the memory device and enables the memory controller to notify the memory device of success or failure to reconstruct the data. The interface may comprise a command interface over bus 32 and/or one or more hardware signals. The memory controller may use this interface to send the memory device information related to the reconstruction success or failure. The memory device uses the success/failure information provided by the memory controller in order to adjust the read thresholds used for reading the memory cells.

The method begins with memory device 24 and/or memory controller 28 initializing a nominal set of read thresholds, at an initialization step 270. When requested to retrieve a given page, unit 48 in memory device 24 reads the page using the nominal read thresholds and provides the read data to the memory controller, at a page reading step 274. The memory controller attempts to decode the ECC, at an ECC decoding step 278. The memory controller sends information related to the success or failure of ECC decoding to the memory device, at a reporting step 282. The memory device adjusts the read thresholds based on the reported information, at a threshold adjustment step 286. Typically, unit 48 computes optimal values of the read thresholds, so that subsequent read operations using the adjusted thresholds would result in successful ECC decoding and data reconstruction.

The memory controller may send any suitable kind of information that characterizes the success or failure of data reconstruction. The information may comprise, for example, an indication of the success or failure of the ECC, a number of errors that were corrected by the ECC, a number of errors that were detected by the ECC, a classification of the errors (e.g., a number of "1" bit values that were corrected to "0", and a number of "0" bit values that were corrected to "1"), and/or any other suitable information. As noted above, the system may use an EDC in addition to or instead of an ECC. In such embodiments, the EDC is considered to be a kind of ECC in the present context.

For example, in many practical cases, the number of "1" bit values that are corrected by the ECC to "0" is expected to be approximately equal to the number of "0" bit values that were corrected to "1". When the number of "1" bit values that were corrected to "0" significantly deviates from the number of "0" bit values that were corrected to "1", unit 48 may adjust the relevant read threshold so as to equalize the two numbers. A threshold value that equalizes the two numbers will typically produce optimal data reconstruction. Other methods for adjusting the read thresholds based on information related to the success or failure of data reconstruction are described in PCT Application PCT/IL2008/000329, cited above.

In some embodiments, read threshold adjustment may be performed only in response to a failure of the memory controller to reconstruct the data using the current thresholds. Alternatively, the memory device may adapt the read thresholds irrespective of the success or failure of the memory controller to reconstruct the data.

Memory Device Acting as Master

Figure 9:
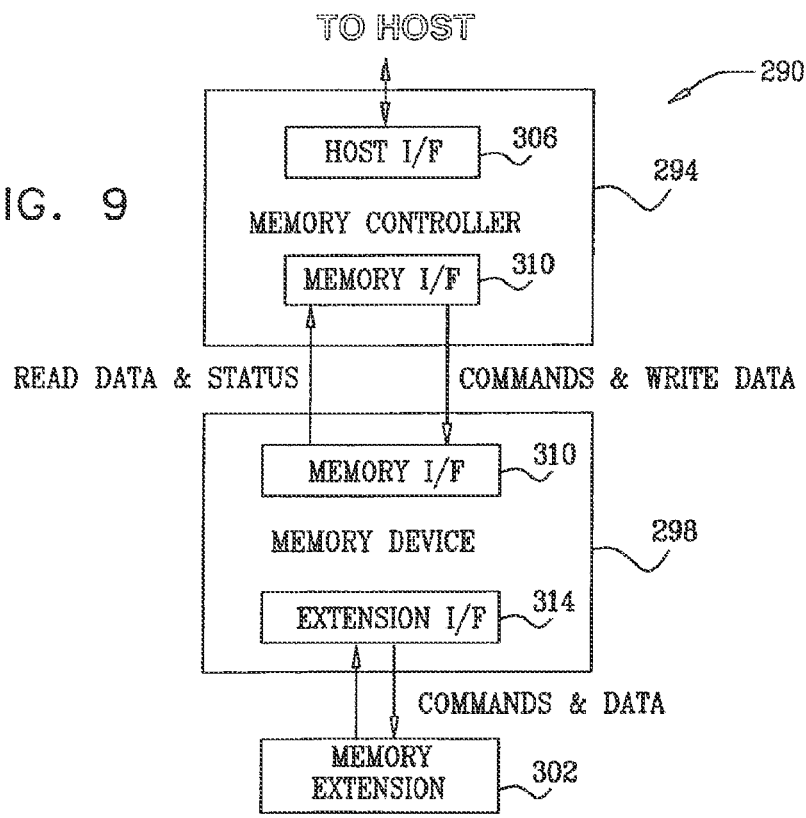
FIG. 9 is a block diagram that schematically illustrates a memory system, in accordance with an alternative embodiment of the present invention.

FIG. 9 is a block diagram that schematically illustrates a memory system 290, in accordance with an alternative embodiment of the present invention. In system 290, a memory controller 294 controls a memory device 298. System 290 further comprises a memory extension unit 302 (also referred to as an auxiliary computation unit), which operates as a slave to memory device 298 and assists in performing various signal processing tasks. Memory device 298 acts as a master of extension unit 302. The memory controller communicates with the host system via a host interface 306, and with the memory device via a memory interface 310. The memory device communicates with extension unit 302 via an extension interface 314. The configuration of FIG. 9 may be advantageous, for example, for reducing the high cost associated with implementing digital logic on the same die as the memory array.

Extension unit 302 may perform various signal processing tasks under the control of memory device 298. For example, unit 302 may calculate the cross-coupling coefficients for interference cancellation. As another example, unit 302 may perform ECC/EDC encoding and/or decoding. In these embodiments, the memory device sends the data for encoding/decoding to the extension unit and activates a command instructing the memory extension to encode/decode the data. Upon completion, the extension unit indicates to the memory device that encoding/decoding is completed and sends the data to the memory device. Alternatively, the extension unit can indicate that ECC decoding has failed, and may report information such as the number and types of errors.

In a typical flow, the memory controller sends a request to the memory device, requesting to retrieve certain data. In response to the request, the memory device reads the appropriate memory cells, and invokes the memory extension unit to preprocess the read results. The preprocessed results are then provided to the memory controller, and the memory controller reconstructs the data from the preprocessed results.

The memory controller, memory device and extension unit may reside on a single die, on two dies (wherein any of the three elements resides on a separate die from the other two), or on three separate dies. Any subset of these dies may be packaged in a separate package. The memory controller may control multiple memory devices. The extension unit may perform signal processing tasks under control of multiple memory devices.

The memory controllers, extension logic and internal and external signal processing units described herein may be implemented in hardware. Alternatively, any of these units may comprise a microprocessor that runs suitable software, or a combination of hardware and software elements. In some embodiments, any of the memory controller, extension logic, internal signal processing unit and/or external processing unit may comprise a general-purpose processor, which is programmed in software to carry out the functions described herein. The software may be downloaded to such a processor in electronic form, over a network, for example, or it may alternatively be supplied to the processors on tangible computer-readable media, such as CD-ROM.

The embodiments described herein refer to a digital interface that connects memory controller 28 to memory device 24. Additionally or alternatively, the memory controller may control the memory device using an analog interface. For example, the memory controller may comprise analog circuitry, such as one or more Digital to Analog (D/A) converters, which produce analog control signals that control the memory device. The analog control signals are typically connected to R/W unit 44 of the memory device.

The analog control signals may control values such as the read thresholds used for reading memory cells 40. In some embodiments, R/W unit 44 programs the memory cells in an iterative Program and Verify (P&V) process, as is well-known in the art. In these embodiments, the analog control signals may control values such as the verification thresholds used for verifying the storage values written to memory cells, the initial magnitude of the P&V pulses or the voltage increment between successive programming pulses. Additionally or alternatively, the analog control signals may control any suitable analog quantity used by the memory device.

In some embodiments, memory controller 28 provides memory device 24 with parameters that are stored in the controller and assist unit 48 in performing the signal processing tasks. For example, the storage value read from a given cell and/or the distortion level in the cell may depend on the current temperature of the system, or on the difference between the temperature at the time the cell was programmed and the temperature at the time the cell is read. Thus, the memory controller may provide the current temperature or the temperature difference to the memory device, so that unit 48 is able to take these parameters into account when reading the cell, e.g., in interference cancellation, soft metric computation and/or read threshold adjustment. As another example, the storage value read from a cell and/or the distortion level in the cell may depend on the time that elapsed since the cell was programmed, and/or on the number of programming and erasure cycles that the cell has gone through. In some embodiments, the memory controller provides these parameters to the memory device, and unit 48 takes the parameters into account, such as when adjusting the read thresholds, computing soft metrics and/or when canceling interference. Exemplary methods of this sort are described, for example, in PCT International Publication WO 2007/132453, cited above.

In some cases, performing two or more read operations with adjacent thresholds can be replaced with an equivalent operation of performing a single read operation (a single sensing operation) and measuring the bit line voltage or current at two or more points in time. Techniques for reading memory cells with adjacent thresholds by sensing the cells at different times are described, for example, in PCT Application PCT/IL2007/001316, entitled "Memory Cell Readout using Successive Approximation," filed Oct. 30, 2007, whose disclosure is incorporated herein by reference. In some embodiments, units 48 and 44 perform multiple read operations with different thresholds, such as for calculating statistical properties of the storage values, for computing soft metrics or for any other purpose, using such techniques.

The embodiments described herein refer to reading or otherwise processing groups of memory cells. Some of the disclosed embodiments refer to reading and processing memory pages. The methods and systems described herein can be applied, however, to any other suitable group of cells, such as sectors, parts of pages, groups of pages, or even entire erasure blocks.

In some of the embodiments described herein, the memory controller provides feedback to unit 48 of the memory device regarding the success or failure of data reconstruction (e.g., ECC decoding), and may provide additional information regarding the data reconstruction process. The memory device uses this feedback in subsequent read operations in various ways. In alternative embodiments, the memory controller may send the memory device various other kinds of feedback information that is applicable to the data reading process. The controller is often in a better position to compute and provide this feedback, since it usually has a stronger processing power and/or storage options than the memory device. For example, the memory controller may hold a database of past usage of read thresholds. The memory controller may use this information to send recommended read threshold values to the memory device, guide its computations or refine its read results. Thus, the feedback regarding data reconstruction that is provided from the memory controller to the memory device can be used to modify the preprocessing operations applied by the memory device.

The feedback provided by the memory controller can be used by the memory device for different purposes, such as for adjusting read thresholds and/or for canceling interference. A given indication (e.g., ECC failure) may be used for multiple purposes simultaneously.

Although the embodiments described herein mainly address data storage and retrieval in solid-state memory devices, the principles of the present invention can also be used for storing and retrieving data in Hard Disk Drives (HDD) and other data storage media and devices.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. An apparatus, comprising:
a memory array including a plurality of pages; and
a processing unit configured to:
receive a read request from a controller to read a first page of the plurality of pages;
read a first set of storage values from the first page of the plurality of pages in response to the read request;
store the first set of storage values in a first buffer;
receive an interference cancellation request from the controller;
read at least one potentially-interfering page of the plurality of pages in response to the interference cancellation request to generate interference results;
read a set of cross-coupling coefficients from a lookup table (LUT), wherein each cross-coupling coefficient specifies an interference level from at least one neighboring cell to a target cell included in the first page of the plurality of pages;
iteratively perform a plurality of read operations on the first page of the plurality of pages to generate a respective plurality of read results, wherein each read operation of the plurality of read operations uses a respective read threshold of a plurality of shifted read thresholds; and
retrieve, for a first read result of the respective plurality of read results, a decision to retain results of a second read result of the respective plurality of read results from the LUT dependent upon at least the first read result and the second read result.

2. The apparatus of claim 1, wherein each read threshold of the plurality of shifted read thresholds is shifted from a nominal threshold value by a respective predetermined offset.

3. The apparatus of claim 1, wherein to iteratively perform the plurality of read operations on the first page of the plurality of pages, the processing unit is further configured to store each read result of the respective plurality of read results in a second buffer.

4. The apparatus of claim 1, wherein to retrieve, for the first read result of the respective plurality of read results, the decision, the processing unit is further configured to retrieve the decision from the LUT dependent upon the interference results.

5. The apparatus of claim 1, wherein the processing unit is further configured to store the decision in a second buffer.

6. The apparatus of claim 1, wherein the processing unit is further configured to send, to the controller, a selected read result of the respective plurality of read results, wherein the selected read result includes a lowest level of interference.

7. A method for operating a memory, wherein the memory includes a plurality of pages, and wherein each page of the plurality of pages includes a plurality of memory cells, the method comprising:
receiving, by the memory, a read request from a controller to read a first page of the plurality of pages;
reading a first set of storage values from the first page of the plurality of pages in response to the read request;
storing the first set of storage values in a buffer;
receiving, by the memory, an interference cancellation request from the controller;
reading at least one potentially-interfering page of the plurality of pages in response to the interference cancellation request to generate interference results;
reading a set of cross-coupling coefficients from a lookup table (LUT), wherein each cross-coupling coefficient specifies an interference level from at least one neighboring cell to a target cell included in the first page of the plurality of pages;
iteratively performing a plurality of read operations on the first page of the plurality of pages to generate a respective plurality of read results, wherein each read operation of the plurality of read operations uses a respective read threshold of a plurality of shifted read thresholds; and
retrieving, for a first read result of the respective plurality of read results, a decision to retain results of a second read result of the respective plurality of read results from the LUT dependent upon at least the first read result and the second read result.

8. The method of claim 7, wherein each read threshold of the plurality of shifted read thresholds is shifted from a nominal threshold value by a respective predetermined offset.

9. The method of claim 7, wherein iteratively perform the plurality of read operations on the first page of the plurality of pages comprises storing each read result of the respective plurality of read results in a buffer.

10. The method of claim 7, wherein retrieving, for the first read result of the respective plurality of read results, the decision, comprises retrieving the decision from the LUT dependent upon the interference results.

11. The method of claim 7, further comprising storing the decision in a buffer.

12. The method of claim 7, further comprising sending, to the controller, a selected read result of the respective plurality of read results, wherein the selected read result includes a lowest level of interference.

13. The method of claim 7, further comprising:
decoding, by the controller, an Error Correction Code (ECC) dependent upon the first set of storage values; and
sending the interference cancellation request to the memory in response to determining that the decoding of the ECC failed.

14. A system, comprising:
a memory device including a plurality of pages;

a controller configured to send a read request to read a first page of the plurality of pages to the memory device;

wherein the memory device is configured to:
- read a first set of storage values from the first page of the plurality of pages in response to the read request;
- store the first set of storage values in a first buffer;
- receive an interference cancellation request from the controller;
- read at least one potentially-interfering page of the plurality of pages in response to the interference cancellation request to generate interference results;
- read a set of cross-coupling coefficients from a lookup table (LUT), wherein each cross-coupling coefficient specifies an interference level from at least one neighboring cell to a target cell included in the first page of the plurality of pages;
- iteratively perform a plurality of read operations on the first page of the plurality of pages to generate a respective plurality of read results, wherein each read operation of the plurality of read operations uses a respective read threshold of a plurality of shifted read thresholds; and
- retrieve, for a first read result of the respective plurality of read results, a decision to retain results of a second read result of the respective plurality of read results from the LUT dependent upon at least the first read result and the second read result.

15. The system of claim 14, wherein each read threshold of the plurality of shifted read thresholds is shifted from a nominal threshold value by a respective predetermined offset.

16. The system of claim 14, wherein to iteratively perform the plurality of read operations on the first page of the plurality of pages, the memory device is further configured to store each read result of the respective plurality of read results in a second buffer.

17. The system of claim 16, wherein the memory device is further configured to store the decision in the second buffer.

18. The system of claim 14, wherein to retrieve, for the first read result of the respective plurality of read results, the decision, the memory device is further configured to retrieve the decision from the LUT dependent upon the interference results.

19. The system of claim 14, wherein the memory device is further configured to send the first set of storage values to the controller.

20. The system of claim 14, wherein the controller is further configured to:
- decode, by the controller, an Error Correction Code (ECC) dependent upon the first set of storage values; and
- send the interference cancellation request to the memory device in response to determining that the decoding of the ECC failed.

* * * * *